United States Patent
Lee et al.

(10) Patent No.: US 10,096,615 B2
(45) Date of Patent: Oct. 9, 2018

(54) SEMICONDUCTOR DEVICE AND METHOD OF MANUFACTURING THE SAME

(71) Applicant: SK hynix Inc., Icheon-si, Gyeonggi-do (KR)

(72) Inventors: Ki Hong Lee, Suwon-si (KR); Seung Ho Pyi, Seongnam-si (KR); Sung Ik Moon, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 20 days.

(21) Appl. No.: 15/445,274

(22) Filed: Feb. 28, 2017

(65) Prior Publication Data
US 2017/0170193 A1  Jun. 15, 2017

Related U.S. Application Data

(62) Division of application No. 13/599,148, filed on Aug. 30, 2012, now Pat. No. 9,620,513.

(30) Foreign Application Priority Data
Jul. 10, 2012 (KR) ........................ 10-2012-0074919

(51) Int. Cl.
| | | |
|---|---|---|
| H01L 27/115 | (2017.01) | |
| H01L 21/033 | (2006.01) | |
| H01L 27/11582 | (2017.01) | |
| H01L 27/11556 | (2017.01) | |
| H01L 27/11548 | (2017.01) | |
| H01L 27/11575 | (2017.01) | |

(52) U.S. Cl.
CPC .... H01L 27/11582 (2013.01); H01L 21/0332 (2013.01); H01L 27/11548 (2013.01); H01L 27/11556 (2013.01); H01L 27/11575 (2013.01)

(58) Field of Classification Search
CPC ........... H01L 21/0332; H01L 27/11548; H01L 27/11556; H01L 27/11575; H01L 27/11582
See application file for complete search history.

(56) References Cited

U.S. PATENT DOCUMENTS

| | | |
|---|---|---|
| 2010/0207186 A1 | 8/2010 | Higashi et al. |
| 2012/0061743 A1 | 3/2012 | Watanabe et al. |
| 2012/0068255 A1 | 3/2012 | Lee et al. |
| 2012/0213009 A1 | 8/2012 | Aritome et al. |
| 2013/0187118 A1* | 7/2013 | Murooka ................ H01L 45/04 257/4 |

FOREIGN PATENT DOCUMENTS

| | | |
|---|---|---|
| KR | 1020110042619 A | 4/2011 |
| KR | 1020120026435 A | 3/2012 |

* cited by examiner

*Primary Examiner* — Tom Thomas
*Assistant Examiner* — Benjamin Tzu-Hung Liu
(74) *Attorney, Agent, or Firm* — William Park & Associates Ltd.

(57) ABSTRACT

A semiconductor device includes a cell structure; n first pad structures formed on one side of the cell structure and each configured to have a step form in which 2n layers form one stage; and n second pad structures formed on the other side of the cell structure each configured to have a step form in which 2n layers form one stage, wherein n is a natural number of 1 or higher, and the first pad structures and the second pad structures have asymmetrical step forms having different heights.

11 Claims, 15 Drawing Sheets

# SEMICONDUCTOR DEVICE AND METHOD OF MANUFACTURING THE SAME

CROSS-REFERENCE TO RELATED APPLICATION

The present application is a divisional application of U.S. application Ser. No. 13/599,148, filed on Aug. 30, 2012, and claims priority to Korean patent application number 10-2012-0074919 filed on Jul. 10, 2012, in the Korean Intellectual Property Office, the entire disclosure of which is incorporated by reference herein.

BACKGROUND

Field of Invention

Embodiments of this disclosure relate to a semiconductor device and a method of manufacturing the same and, more particularly, to a three-dimensional (3-D) semiconductor device including pad structures and a method of manufacturing the same.

Description of the Related Art

A nonvolatile memory device retains stored data although the supply of power to the device may be cut-off. As the degree of integration of 2-D structured memory devices including memory cells fabricated on a single layer of a silicon substrate is approaching a limit, a 3-D structured nonvolatile memory device has been proposed. The 3-D nonvolatile memory device typically includes memory cells that are vertically stacked on a silicon substrate.

In this 3-D nonvolatile memory device, desired memory cells are driven by supplying biases to respective word lines stacked in multiple layers over a substrate. To drive memory cells by supplying biases to respective word lines, a pad unit is formed for each word line by patterning the word lines, formed in a slimming region, in a step form. Furthermore, contact plugs and metal lines coupled to the respective word lines are formed so that the word lines stacked in multiple layers may be controlled.

FIG. 1 is a perspective view showing a structure of a known 3-D nonvolatile memory device. For ease of description, only a cell structure and pad structures are illustrated in FIG. 1.

As shown in FIG. 1, the known 3-D nonvolatile memory device includes a cell region CR and first and second slimming regions SR1 and SR2 placed on both sides of the cell region CR.

The cell structure C placed in the cell region CR includes channel layers CH configured to penetrate the cell structure C in a stack direction.

Pad structures P1 and P2 are formed in the slimming regions SR1 and SR2. Each of the pad structures P1 and P2 includes a step form in which one layer forms one stage. In order to form these pad structures, after forming word lines stacked in multiple layers, an etch process is repeatedly performed while reducing one mask pattern.

In a structure, such as that described above, the pad structures P1 and P2 are formed in a step form in which one layer forms one stage. Accordingly, the slimming regions SR1 and SR2 become wide, and an improvement in the degree of integration of memory devices is limited. Furthermore, in order to form n layers of the pad structures P1 and P2 in a step form, n etch processes must be performed, thereby increasing the complexity of the etching process.

BRIEF SUMMARY

An example embodiment of this disclosure relates to a semiconductor device suitable for a simplified slimming process and a method of manufacturing the same.

In an embodiment of this disclosure, a semiconductor device includes a cell structure; n first pad structures formed on one side of the cell structure and each configured to have a step form in which 2n layers form one stage; and n second pad structures formed on the other side of the cell structure each configured to have a step form in which 2n layers form one stage, wherein n is a natural number of 1 or higher, and the first pad structures and the second pad structures have asymmetrical step forms having different heights.

In another embodiment of this disclosure, a method of manufacturing a semiconductor device includes forming a stack structure in which a cell region and slimming regions placed on opposite sides of the cell region are defined; performing a primary slimming process of selectively etching the slimming regions of the stack structure to form a cell structure and n first pad structures and n second pad structures placed on opposite sides of the cell structure, wherein the slimming regions are selectively etched so that steps are formed between the first and the second pad structures; and performing a secondary slimming process of forming a mask pattern through which the ends of the first and the second pad structures are exposed over the stack structure and etching 2n layers of the first and the second pad structures using the mask pattern as an etch barrier so that each of the first and the second pad structures has a step form in which 2n layers form one stage, wherein the n is a natural number of 1 or higher.

DESCRIPTION OF EMBODIMENTS

Hereinafter, some example embodiments of the present disclosure will be described in detail with reference to the accompanying drawings. The figures are provided to provide those having ordinary skill in the art to understand the scope of the embodiments of the disclosure.

Figure 1:
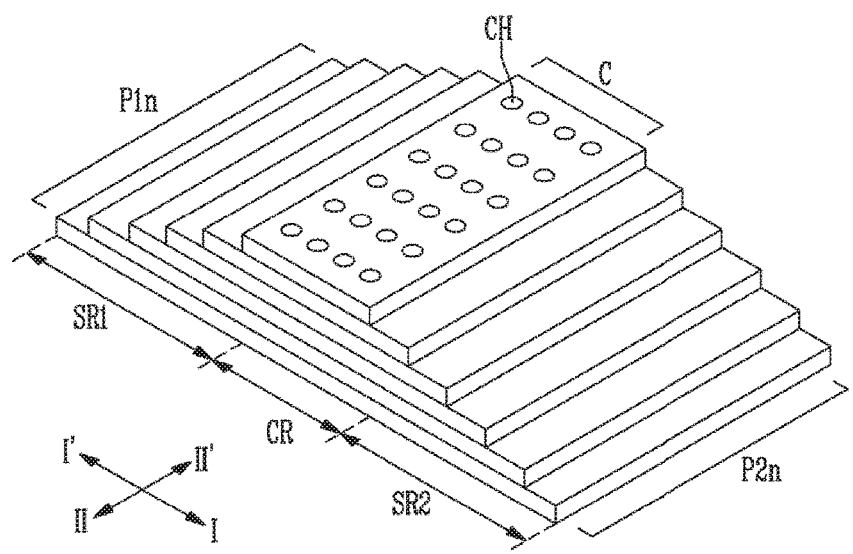
FIG. 1 is a perspective view showing a structure of a known 3-D nonvolatile memory device.
Figure 2:
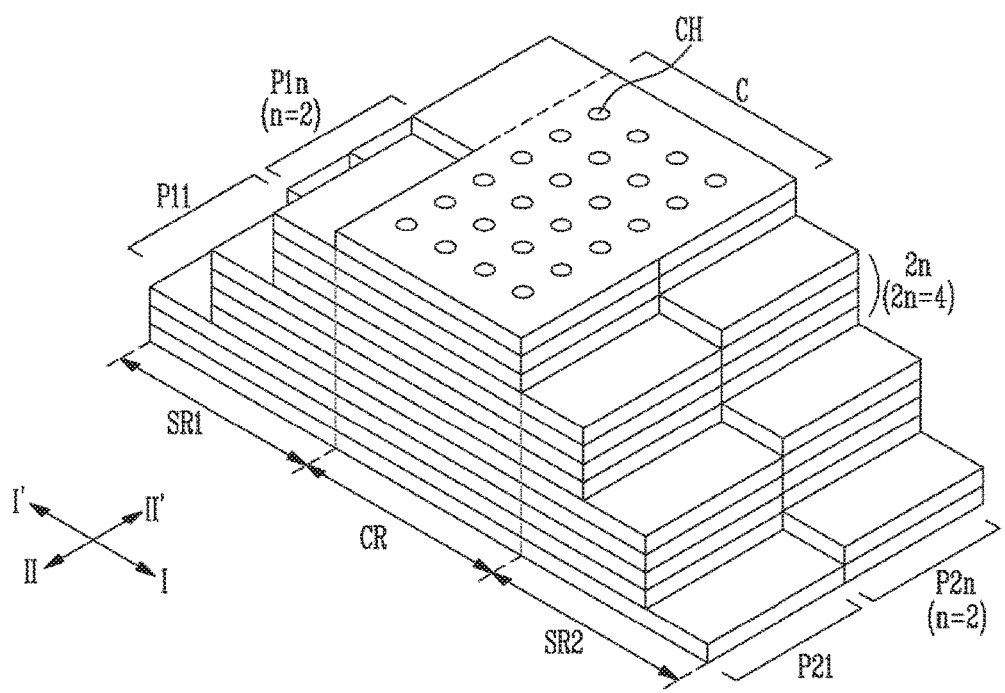
FIG. 2 is a perspective view showing a structure of a semiconductor device in accordance with an embodiment of this disclosure.

FIG. 2 is a perspective view showing a structure of a semiconductor device in accordance with an embodiment of this disclosure. For ease of description only a cell structure and pad structures are illustrated in FIG. 2.

As shown in FIG. 2, the semiconductor device in accordance with an embodiment of this disclosure includes a cell structure C and first and second pad structures P11 to P22.

The cell structure C and the first and the second pad structures P11 to P22 are formed by selectively etching one stack structure. Accordingly, the cell structure C and the first and the second pad structures P11 to P22 are formed in such a way as to be interconnected. In this specification, for ease of description the cell structure C and the first and the second pad structures P11 to P22 are divided and defined according to their regions.

The cell structure C is formed in a cell region CR. The cell structure C includes interlayer insulating layers and conductive layers which are alternately stacked. The cell structure C may further include channel layers CH configured to penetrate the interlayer insulating layers and the conductive layer in the stack direction.

First pad structures P11 and P12 are placed in a first slimming region SR1 and are coupled to one side of the cell structure C. A number n (for example, n=2) of the first pad structures P11 and P12 are formed in the first slimming region SR1. Here, n is a natural number of 1 or higher. Each of the first pad structures P11 and P12 has a step form in which 2n (for example, 2n=4) layers may form one stage. However, in some embodiments, in view of a characteristic of this disclosure that there may be a step between the first and the second pad structures P11 to P22, the highest stage and lowest stages of each of the pad structure P11 to P22 may include fewer layers than 2n (for example, 2n=4) layers.

Second pad structures P21 and P22 are placed in a second slimming region SR2 and are coupled to an other side of the cell structure C. For example, the second pad structures P21 and P22 are placed on the opposite side of the cell structure C as the first pad structures P11 and P12, with the cell structure C interposed between them. A number n (for example, n=2) of the second pad structures P21 and P22 are formed in the second slimming region SR2. Furthermore, each of the second pad structures P21 and P22 has a step form in which 2n (for example, 2n=4) layers form one stage.

Each of the layers of the first and the second pad structures P11 to P22 includes a stack of an interlayer insulating layer and a conductive layer and may include an upper interlayer insulating layer and a lower conductive layer, or an upper conductive layer and a lower interlayer insulating layer. For example, if the first and the second pad structures P11 to P22 include first conductive layers and first interlayer insulating layers alternately stacked, and the cell structure C includes second conductive layers and second interlayer insulating layers alternately stacked, the first conductive layer and the second conductive layer of a substantially same level may be coupled, and the first interlayer insulating layer and the second interlayer insulating layer of a substantially same level may be coupled.

Furthermore, the first and the second pad structures P11 to P22 have respective step forms each having steps formed in opposite directions in relation to the cell structure C. In other words, each of the first and the second pad structures P11 to P22 has a form in which a step is formed in a first direction I-I', and the first pad structures P11 and P12 and the second pad structures P21 and P22 have steps formed in opposite directions. For example, when viewing the first and second pad structures P11 to P22 in the direction from I' to I, the step of the first pad structures P11 and P12 may ascend and the second pad structures P21 and P22 may descend.

Furthermore, the first pad structures P11 and P12 adjacent to each other in a second direction II-II' have a step of one layer, and the second pad structures P21 and P22 adjacent to each other in the second direction II-II' also have a step of one layer. Furthermore, each of the pair of first and the second pad structures P12 and P21 placed on opposite sides of the cell structure C and the pair of first and second pad structures P11 and P22 placed on opposite sides of the cell structure C has n (for example, n=2) layers of steps. Accordingly, the first pad structures P11 and P12 have an asymmetrical structure, the second pad structures P21 and P22 have an asymmetrical structure, the first pad structures P11 and P12 and the second pad structures P21 and P22 also have an asymmetrical structure.

In a structure, such as that described above, the first and the second slimming regions SR1 and SR2 are defined on opposite sides of the cell region CR. Furthermore, the first slimming region SR1 is split into n (for example, n=2), and n of the first pad structures are formed in the split slimming regions. The second slimming region SR2 is split into n (for example, n=2), and n (for example, n=2) number of the second pad structures are formed in the split regions. In particular, the first pad structures and the second pad structures have an asymmetrical step form having steps. When a number of the pad structures are formed in an asymmetrical step form as described above, the area of the slimming region can be reduced as compared with a known art.

FIGS. 3A to 6B are diagrams illustrating a method of manufacturing the semiconductor device in accordance with the embodiment of this disclosure as seen in FIG. 2. An 'a' figure of each of FIGS. 3 to 6 is a layout diagram, and a 'b' figure of each of FIGS. 3 to 6 shows a perspective view.

Figure 3A:
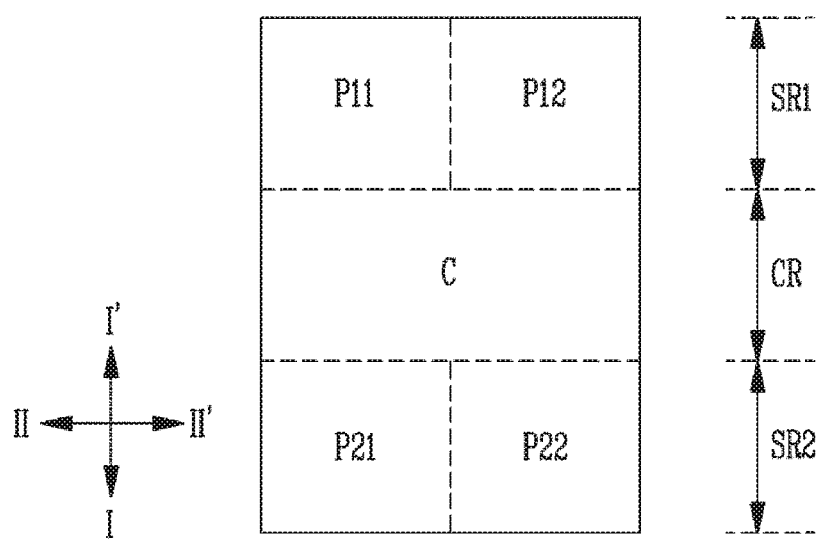
FIGS. 3A to 6B are diagrams illustrating a method of manufacturing the semiconductor device in accordance with an embodiment of this disclosure.
Figure 3B:
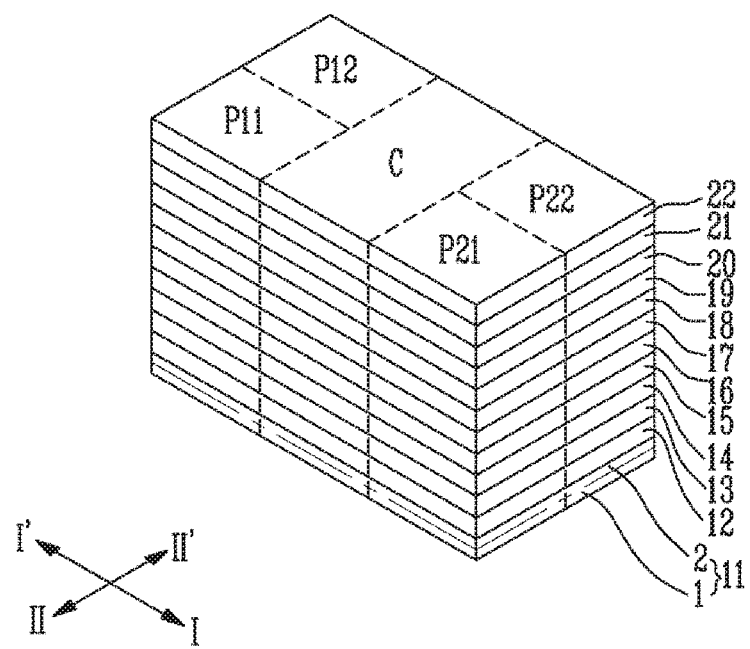

As shown in FIGS. 3A and 3B, a stack structure is formed in which the cell region CR and the first and the second slimming regions SR1 and SR2 placed on opposite sides of the cell region CR are defined. Here, the first slimming region is a region in which n (for example, n=2) number of the first pad structures P11 and P12 will be formed, and the second slimming region is a region where n (for example, n=2) number of the second pad structures P21 and P22 will be formed.

The stack structure may be formed by alternately stacking first material layers 1 and second material layers 2. Here, the second material layer 2 on the upper side and the first material layer 1 on the lower side form one layer (11 to 19), and the stack structure includes multiple layers.

In an embodiment, the second material layer 2 and the first material layer 1, which are stacked on top of each other, are illustrated as forming one layer (11 to 22), and the case where the stack structure includes a total of m (for example, m=12; 11 to 22) layers is described below.

For example, the first material layers 1 and the second material layers 2 may be alternately stacked over a substrate in which underlying structures, such as a source region, are formed, thus forming the stack structure. Here, the first material layers 1 are used to form conductive layers for word lines or selection lines, and each of the second material layers 2 is used to separate the stacked conductive layers from each other. The first material layers 1 may be formed with different thicknesses according to the intended use of the material layer. For example, the conductive layers for selection lines may have the same thickness as or thicker than the conductive layers for word lines.

Furthermore, the first material layer 1 and the second material layer 2 are made of materials having a high etch selectivity. For example, the first material layer 1 may be formed of a conductive layer, such as a polysilicon layer, and the second material layer 2 may be formed of an insulating layer, such as an oxide layer. In another example, the first material layer 1 may be formed of a conductive layer, such as a doped polysilicon layer or a doped amorphous silicon layer, and the second material layer 2 may be formed of a sacrificial layer, such as an undoped polysilicon layer or an undoped amorphous silicon layer. In yet another example, the first material layer 1 may be formed of a sacrificial layer, such as a nitride layer, and the second material layer 2 may be formed of an insulating layer, such as an oxide layer.

As shown in FIGS. 4A to 5B, a primary slimming process of defining the cell structure C and the pad structures P11 to P22 by selectively etching the slimming regions of the stack structure is performed.

Figure 4A:
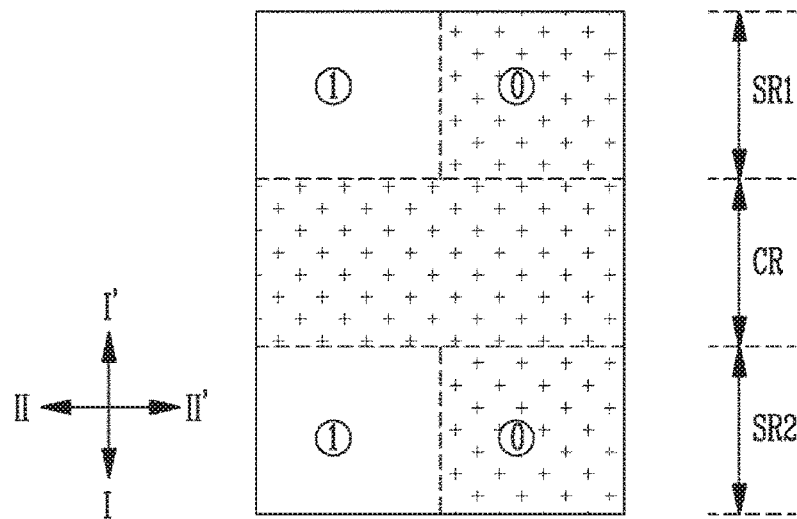
Figure 4B:
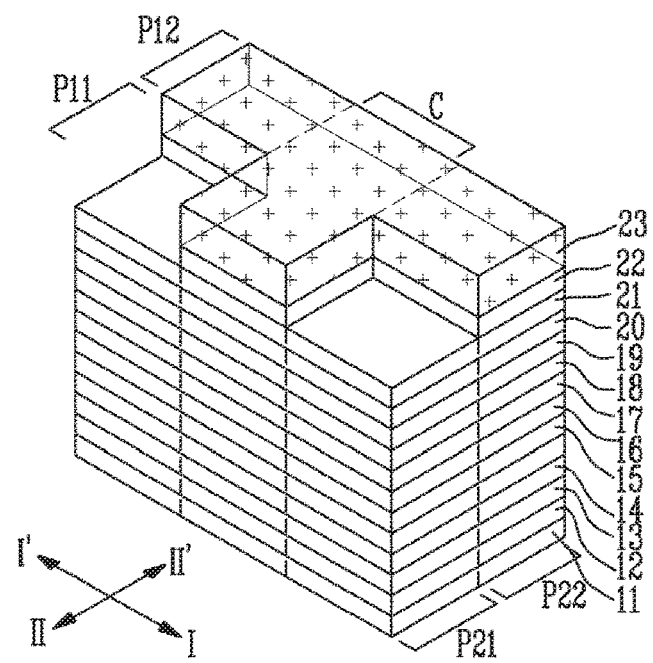

First, as shown in FIGS. 4A and 4B, after forming a first mask pattern 23 such that regions where the pair of first and second pad structures P11 and P21 remain exposed, one layer 22 that consists of the first and the second pad structures P11 and P21 is etched using the first mask pattern 23 as an etch barrier.

Accordingly, a step is formed between the pad structures P11 and P12 placed in the same slimming region, and a step is formed between the pad structures P21 and P22 placed in the same slimming region. That is, a step is formed between the first pad structures P11 and P12 adjacent to each other in the second direction II-II', and a step is formed between the second pad structures P21 and P22 adjacent to each other in the second direction II-II'.

At this point, the first and the second pad structures P11 and P21 placed on opposite sides of the cell structure C and the first and the second pad structures P12 and P22 placed on opposite sides of the cell structure C have a symmetrical structure. That is, the first and the second pad structures P11 and P21 have a form in which one layer has been etched, and the first and the second pad structures P12 and P22 have a form in which none of the layers have been etched. In order to help understanding, the number of layers etched in each pad structure is shown within a circle in the layout diagram of FIG. 4A.

Figure 5A:
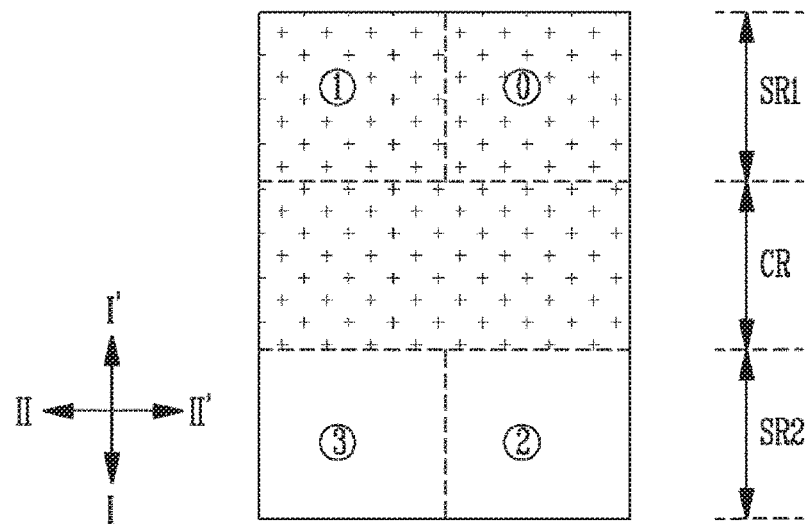
Figure 5B:
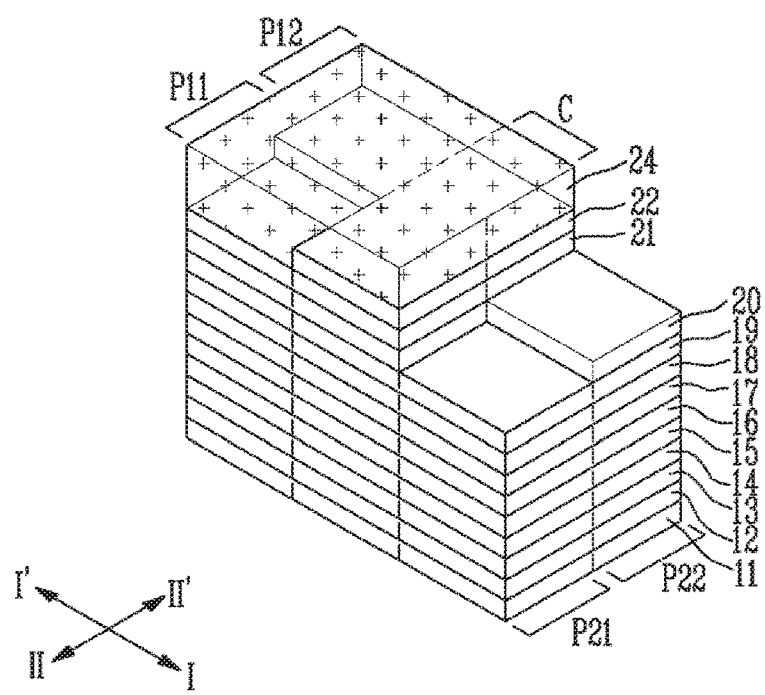

Next, as shown in FIGS. 5A and 5B, after forming a second mask pattern 24 such that the second pad structures P21 and P22 remain exposed, n (for example, n=2) layers of the second pad structures are etched by using the second mask pattern 24 as an etch barrier. Here, n (for example, n=2) layers of the second pad structures P21 and P22 are etched from the top while maintaining a step therebetween. For example, two layers 20 and 21 at the top of the second pad structure P21 are etched, and two layers 21 and 22 at the top of the second pad structure P22 are etched, so that the step is maintained between the second pad structures P21 and P22.

In some embodiments, the second mask pattern 24 may be formed such that the first pad structures P11 and P12 remain exposed.

As a result, a step is formed between the first and the second pad structures P11 and P21 placed on opposite sides of the cell structure C, and a step is formed between the first and the second pad structures P12 and P22 placed on opposite sides of the cell structure C. Accordingly, a step is formed between all the first and the second pad structures P11 to P22.

After the primary slimming process is completed, there is a step not only between the first and the second pad structures P11 to P22 adjacent to each other in the second direction II-II', but also between the first and the second pad structures P11 to P22 placed on opposite sides of the cell structure C in the first direction I-I'. In some embodiments, after forming a step between the first and the second pad structures P11 to P22 placed on opposite sides of the cell structure C, a step may be formed between the first and the second pad structures P11 to P22 adjacent to each other in the second direction II-II'.

Figure 6A:
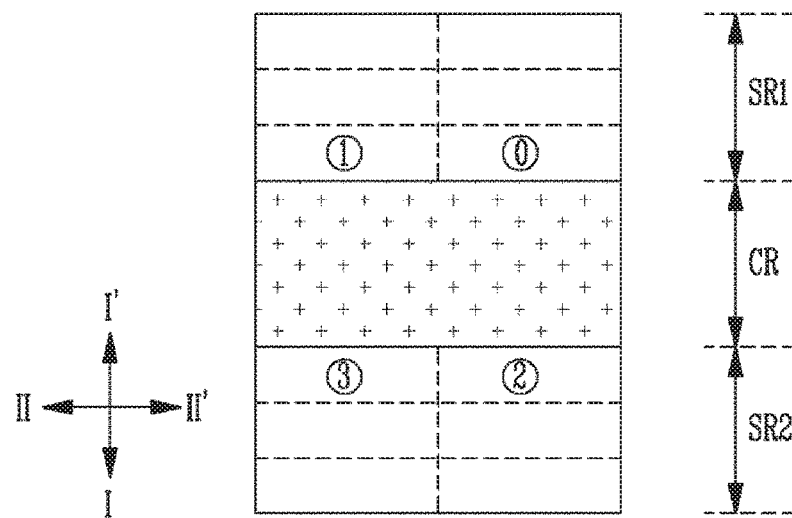
Figure 6B:
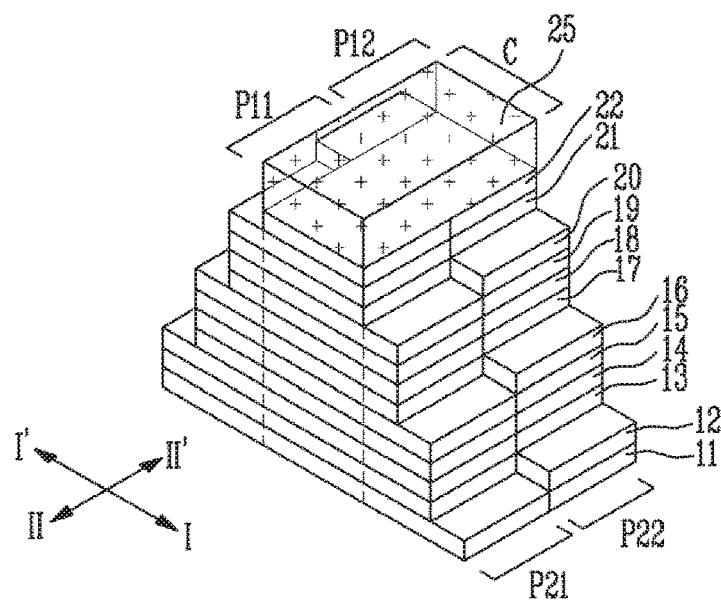

As shown in FIGS. 6A and 6B, a secondary slimming process of patterning the first and the second pad structures P11 to P22 in a step form is performed.

First, a third mask pattern 25 is formed such that ends of the first and the second pad structures P11 to P22 in the first direction I-I' remain exposed, the third mask pattern 25 may be formed over the stack structure on which the primary slimming process has been completed. The third mask pattern 25 is formed to have a size such that the ends of the first and the second pad structures P11 to P22 that remain exposed have a width equal to the pad unit of the first material layer 1 included in each layer. Furthermore, the third mask pattern 25 is formed to be thick enough to function as an etch barrier although the third mask pattern 25 may be reduced in a subsequent etch process.

2n (for example, 2n=4) layers are etched by using the third mask pattern 25 as an etch barrier. Here, a step between the first and the second pad structures P11 to P22 remains intact, and the stack structure is etched by 2n (for example, 2n=4) layers from the tops of the first and the second pad structures P21 to P22.

Next, the third mask pattern 25 is reduced. The third mask pattern 25 is reduced by a width equal to the pad unit of the first material layer 1 included in each layer in the first direction I-I'. Accordingly, the first and the second pad structures P11 to P22 are extended in a direction away from the cell structure C, i.e., in the first I-I' direction, thus being patterned in a step form, such that the steps of each first and second pad structures P11 to P22 descend as the steps extend away from the cell structure C. For example, if the cell structure C is placed in the direction I on the basis of the first pad structures P11 and P12, the first pad structures P11 and P12 are patterned to have a step while extending in the direction I'. Furthermore, if the cell structure C is placed in the direction I' on the basis of the second pad structures P21 and P22, the second pad structures P21 and P22 are patterned to have a step while extending in the direction I.

In some embodiments, the first material layers 1 included in each layer may have pad units having the same width or the pad units having different widths. For example, the first material layer 1 on the lower side may have the pad unit having a wider width by taking an alignment margin of contact plugs and pad units formed in a subsequent process into consideration. In this case, the decrement of the width is reduced whenever the third mask pattern 25 is reduced.

Next, 2n (for example, 2n=4) layers are etched by using the third mask pattern 25 as an etch barrier. Here, the first etched 2n (for example, 2n=4) layers at the top and 2n (for example, 2n=4) layers under the first etched 2n layers are etched at the same time. The processes of reducing the third mask pattern 25 and etching the 2n layers as described above are repeated until a total of m (for example, m=12) layers are etched.

As a result, the first and the second pad structures P11 to P22 each having a step form in which the 2n (for example, 2n=4) layers form one stage are formed. For example, the first pad structure P11 is patterned in a step form having 3 stages 11 to 13, 14 to 17, and 18 to 21, and the first pad structure P12 is patterned in a step form having 3 stages 11 to 14, 15 to 18, and 19 to 22. Furthermore, the second pad structure P21 is patterned in a step form having 3 stages 11, 12 to 15, and 16 to 19, and the second pad structure 22 is patterned in a step form having 3 stages 11 to 12, 13 to 16, and 17 to 20.

In some embodiments, after performing the secondary slimming process, the primary slimming process may be performed.

Next, a process of forming the memory cells of the cell structure is performed although (not shown). For example, after forming channel layers penetrating the cell structure C, an insulating layer may be filled within slits. Thus, the memory cells stacked in the cell region CR are formed.

After forming the slits, an additional process may be performed depending on the type of first material layers 1 and second material layers 2.

For example, the first material layer 1 may be a conductive layer, and the second material layer 2 may be formed of an insulating layer. In this case, after siliciding the first material layers 1 that remain exposed within the slits, an insulating layer is filled within the slits.

Here, an air gap may be formed within the slits depending on a method of depositing the insulating layer.

For another example, the first material layer 1 may be formed of a conductive layer, and the second material layer 2 may be formed of a sacrificial layer. In this case, after removing the second material layers 2 exposed within the slits, an insulating layer is filled within the regions from which the second material layers 2 have been removed and within the slits. Here, an air gap may be formed within the regions from which the second material layers 2 have been removed and within the slits depending on a method of depositing the insulating layer.

For yet another example, the first material layer 1 may be formed of a sacrificial layer, and the second material layer 2 may be formed of an insulating layer. In this case, the second material layers 2 exposed within the slits are removed. Next, word lines and selection lines are formed by filling a conductive layer made of tungsten (W) within the regions from which the first material layers 1 have been removed. Next, an insulating layer 40 (see FIG. 8B) is filled within the slits.

In accordance with the above method, the slimming process can be simplified as compared with a known method because the pad structure is patterned in a step form in which 2n (2n=4) layers form one stage.

Figure 7:
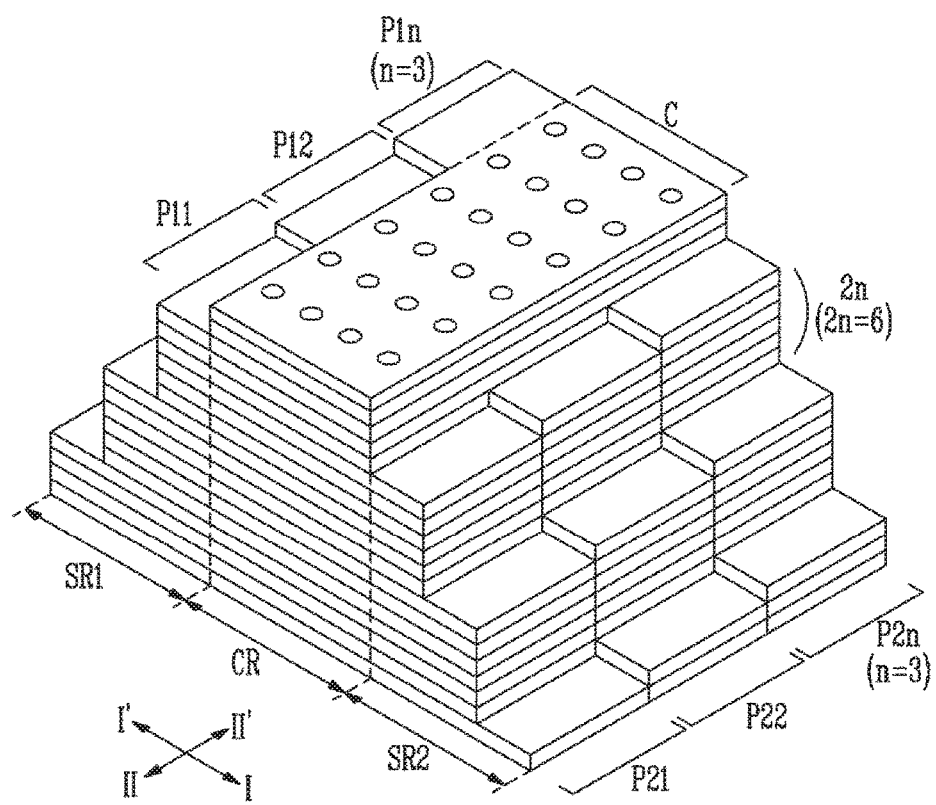
FIG. 7 is a perspective view showing a structure of a semiconductor device in accordance with an embodiment of this disclosure.

FIG. 7 is a perspective view showing the structure of a semiconductor device in accordance with a second embodiment of this disclosure. For ease of description, only a cell structure and pad structures are illustrated in this figure. For purposes of brevity, descriptions that are substantially similar to the descriptions given in connection with the embodiment shown in FIG. 2 are omitted.

As shown in FIG. 7, a semiconductor device in accordance with an embodiment of this disclosure includes a cell structure C placed in a cell region CR and first and second pad structures P11 to P23 placed in first and second slimming regions SR1 and SR2. The first and the second slimming regions SR1 and SR2 include n (for example, n=3) pad structures P11 to P13 and P21 to P23, respectively, and each of the pad structures P11 to P23 has a step form in which 2n (for example, 2n=6) layers may form one stage.

FIGS. 8A to 12B are diagrams illustrating a method of manufacturing the semiconductor device in accordance with the embodiment of this disclosure shown in FIG. 7. An 'a' figure of each of FIGS. 8 to 12 is a layout diagram, and 'b' and 'c' figures of each of FIGS. 8 to 12 show perspective views. Contents redundant with descriptions given in relation to previous embodiments are omitted, for simplicity.

Figure 8A:
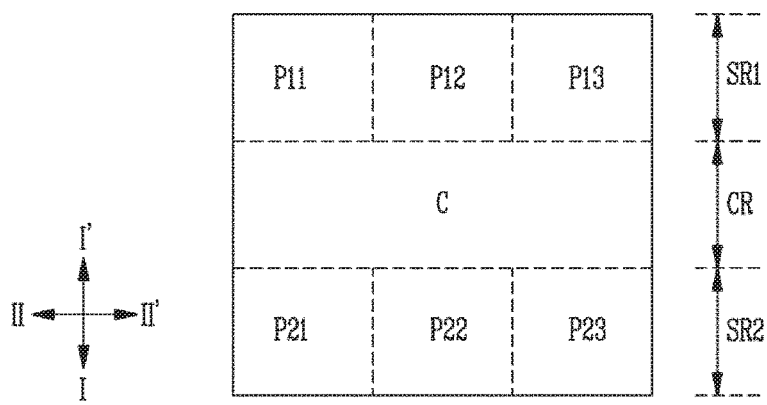
FIGS. 8A to 12B are diagrams illustrating the method of manufacturing the semiconductor device in accordance with an embodiment of this disclosure.
Figure 8B:
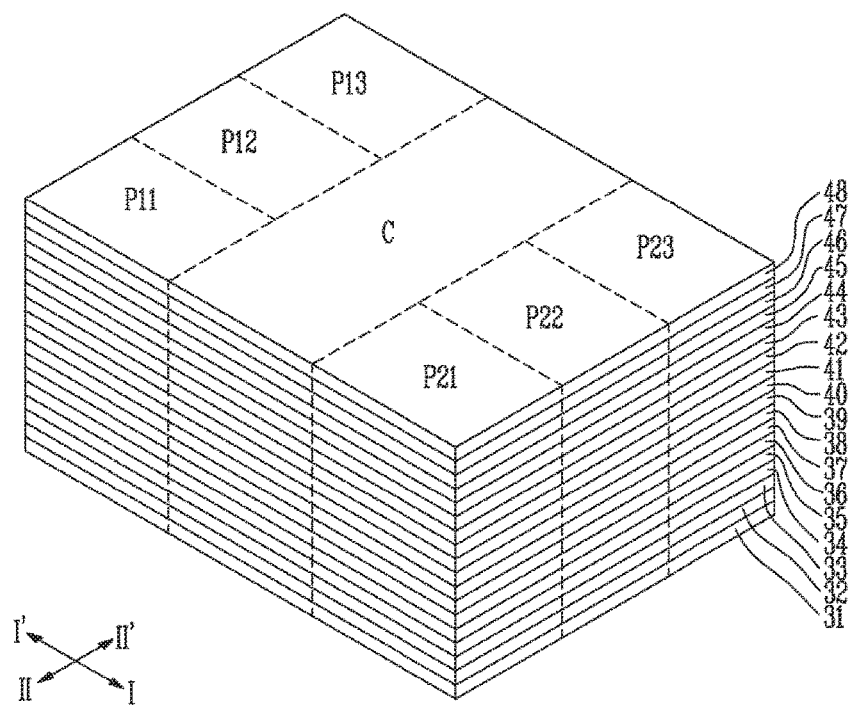

As shown in FIGS. 8A and 8B, a stack structure is formed in which the cell region CR and the first and the second slimming regions SR1 and SR2, placed on opposite sides of the cell region CR, are defined. The first and the second slimming regions SR1 and SR2 are regions where the n (for example, n=3) pad structures P11 to P23 will be formed. Furthermore, the stack structure is formed of m (for example, m=18; 31 to 48) layers.

As shown in FIGS. 9A to 10B, a step is formed between the pad structures P11, P12, and P13 placed in the same slimming region, and a step is formed between the pad structures P21, P22, and P23 placed in the same slimming region.

Figure 9A:
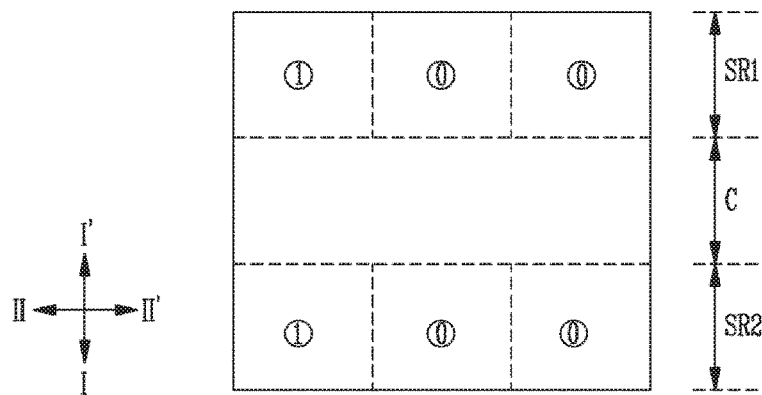
Figure 9B:
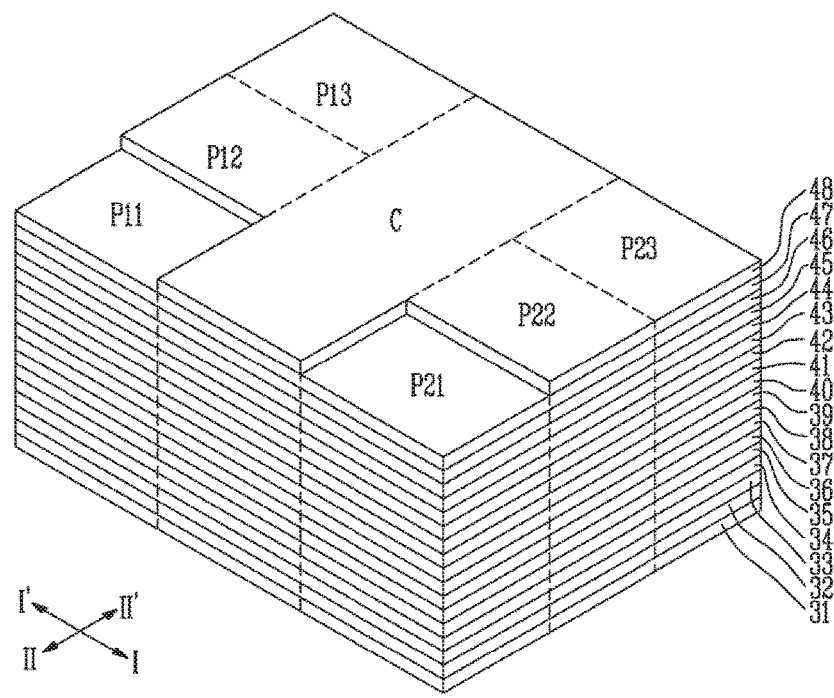

As shown in FIGS. 9A and 9B, there is formed a first mask pattern (not shown) such that regions where the pair of first and second pad structures P11 and P21 will be formed remain exposed. One layer 48 of the first and the second pad structures P11 and P21 is etched using the first mask pattern as an etch barrier.

Figure 10A:
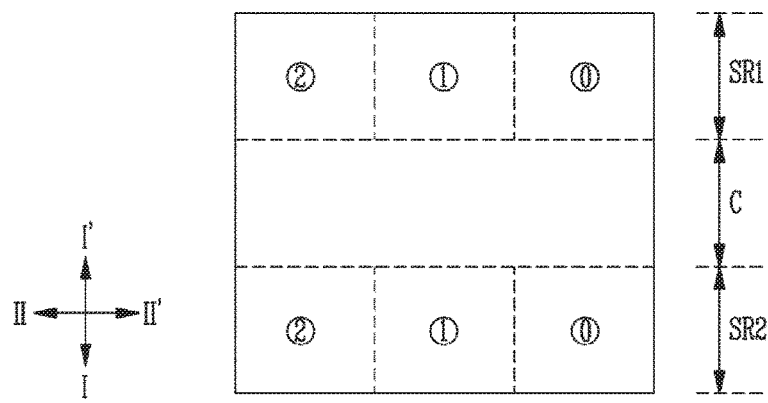
Figure 10B:
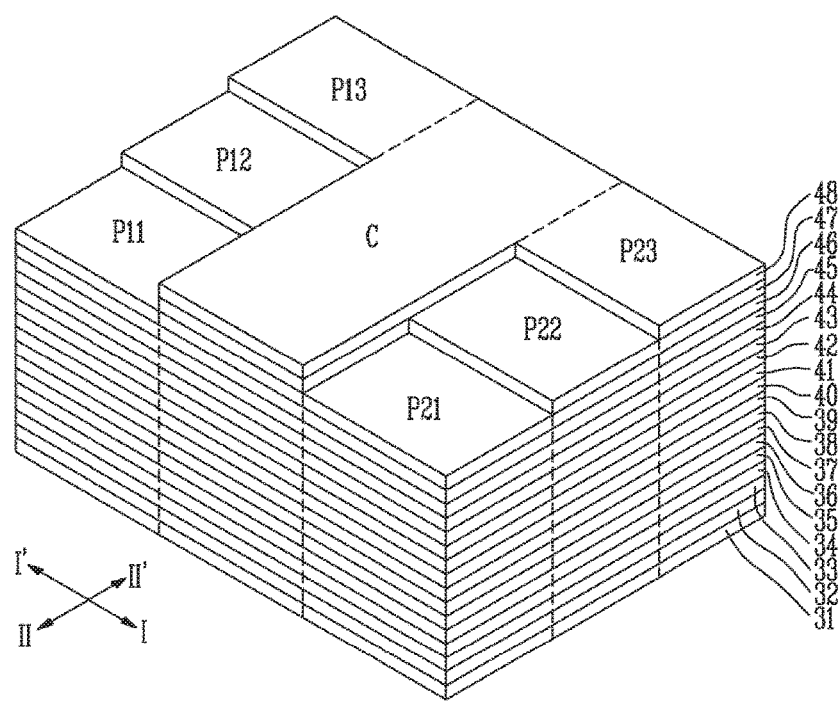

Next, as shown in FIGS. 10A and 10B, the first mask pattern is reduced in a second direction II-II' so that the pair of first and second pad structures P12 and P22 placed on opposite sides of the cell structure C are exposed. One layer (47 and 48) that consists of the first and the second pad structures P11 to P22 is etched using the reduced first mask pattern as an etch barrier. At this time, the one layer 47 of the first and the second pad structures P11 and P21 first etched and the one layer 48 of the first and the second pad structures P12 and P22 newly exposed are etched at the same time, so the first and the second pad structures P11 and P21 maintain a step of one layer.

Accordingly, a step is formed between the pad structures P11, P12, and P13 placed in the same slimming region, and a step is formed between the pad structures P21, P22, and P23 placed in the same slimming region. Here, the processes of reducing and etching the first mask pattern is repeated until a step is formed between the pad structures P11, P12, and P13 placed in the first slimming region SR1 and between the pad structures P21, P22, and P23 placed in the second slimming region SR2. For example, if each of the first and the second slimming regions SR1 and SR2 includes n pad structures, an etch process may be performed (n−1) times while reducing the first mask pattern.

Figure 11A:
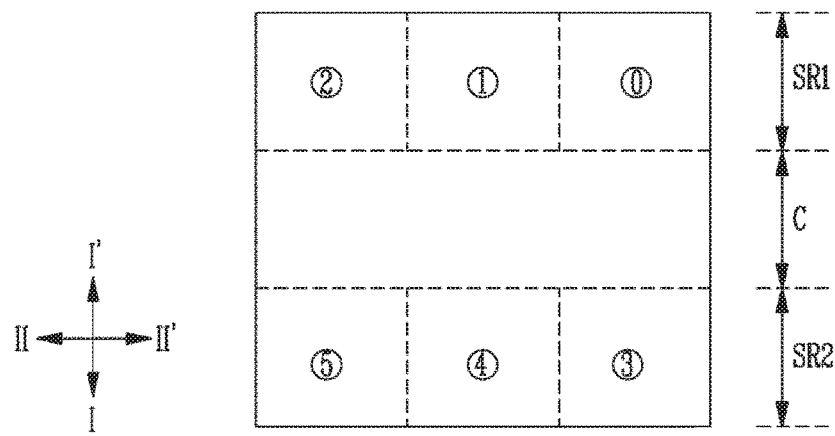
Figure 11B:
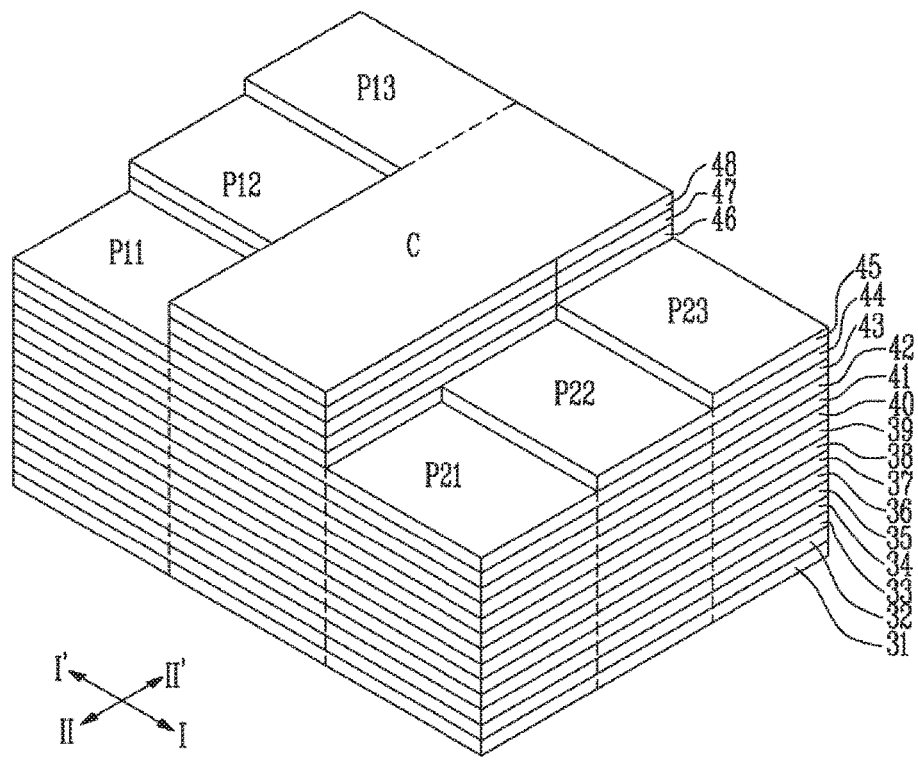

As shown in FIGS. 11A and 11B, after forming a second mask pattern (not shown) such that the second pad structures P21 to P23 remain exposed, n (for example, n=3) layers of the second pad structures P21 to P23 are etched using the second mask pattern as an etch barrier.

Thus, a step is formed between all the first and the second pad structures P11 to P33, and thus the primary slimming process is completed.

Figure 12A:
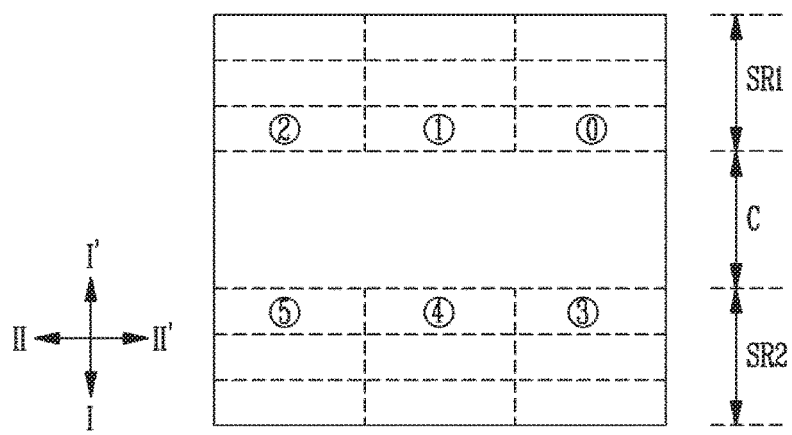
Figure 12B:
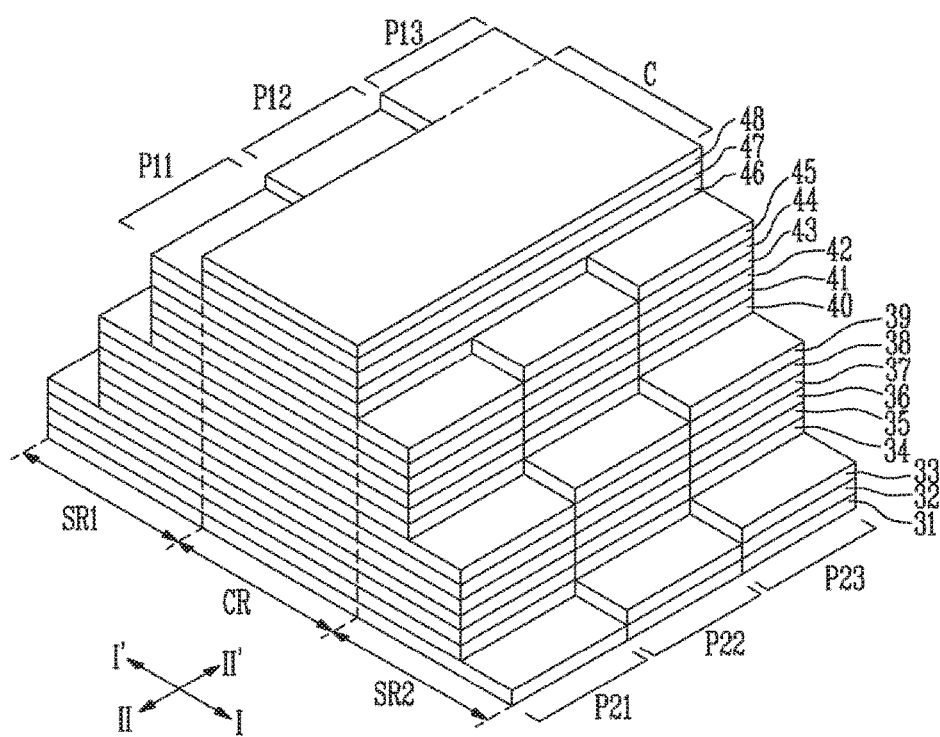

As shown in FIGS. 12A and 12B, a third mask pattern (not shown) such that the ends of the first and the second pad structures P11 to P23 in a first direction I-I' remain exposed is formed on the results on which the primary slimming process has been completed. 2n (for example, 2n=6) layers at the top are etched using the third mask pattern as an etch barrier. The step between the first and the second pad structures P11 to P23 remains intact, and the 2n (for example, 2n=6) layers at the top are etched.

After reducing the third mask pattern, the 2n (for example, 2n=6) layers are etched using the reduced third mask pattern as an etch barrier. Here, the 2n (for example, 2n=6) layers first etched at the top and 2n (for example, 2n=6) layers under the 2n (for example, 2n=6) layers are etched at the same time. The process of etching the 2n (for example, 2n=6) layers after reducing the third mask pattern is repeatedly performed until a total of m (for example, m=18) layers are fully patterned.

As a result, the first and the second pad structures P11 to P23 are formed, such that each of the first and second pad structures P11 to P23 each may have a step form in which the 2n (for example, 2n=6) layers form one stage. For example, the first pad structure P11 is patterned in a step form having 3 stages 31 to 34, 35 to 40, and 41 to 46; the first pad structure P12 is patterned in a step form having 3 stages 31 to 35, 36 to 41, and 42 to 47; and the first pad structure P13 is patterned in a step form having 3 stages 31 to 36, 37 to 42, and 43 to 48. Furthermore, the second pad structure P21 is patterned in a step form having stages 31, 32 to 37, and 38 to 43; the second pad structure P22 is patterned in a step form having 3 stages 31 to 32, 33 to 38, and 39 to 44; and the second pad structure P23 is patterned in a step form having 3 stages 31 to 33, 34 to 39, and 40 to 45.

Figure 13:
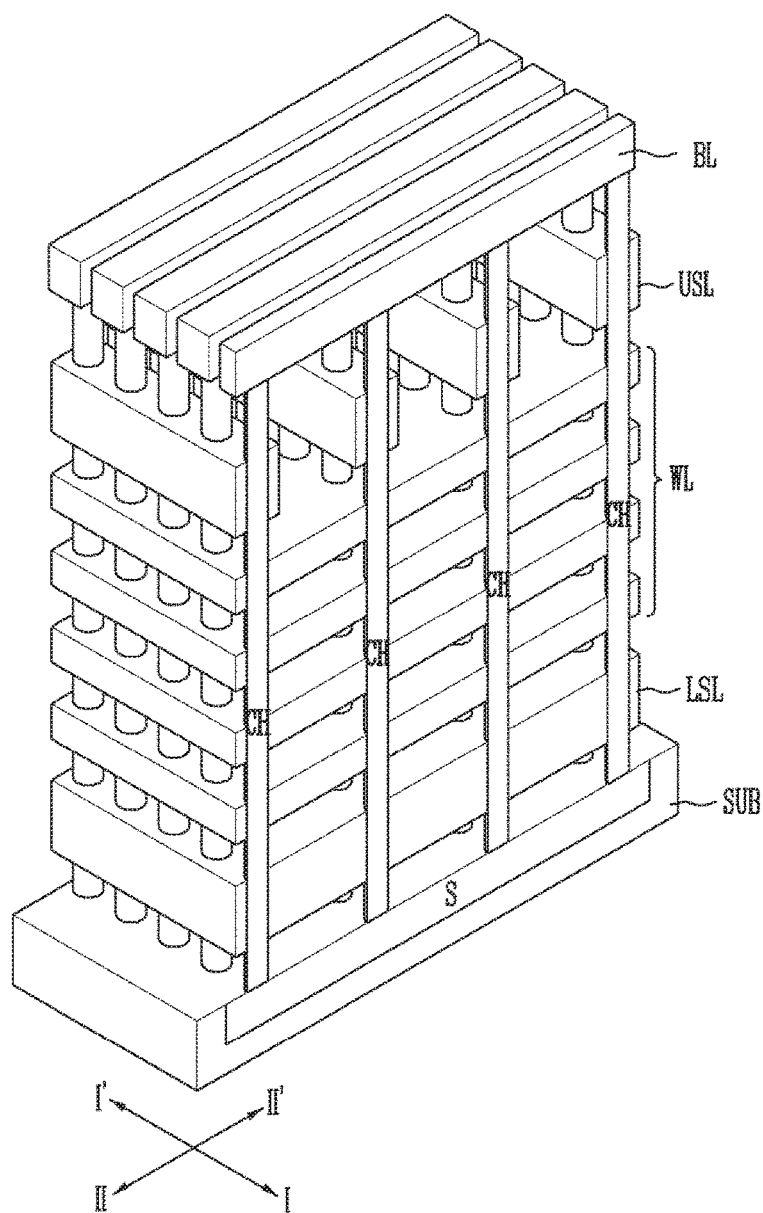
FIGS. 13 to 15 are perspective views showing the cell structure of a semiconductor device to which embodiments of this disclosure have been applied.

FIG. 13 is a perspective view showing the cell structure of a semiconductor device to which embodiments of this disclosure has been applied. For ease of description, an insulating layer is not shown.

As shown in FIG. 13, the semiconductor device in accordance with an example embodiment of this disclosure includes at least one layer of a lower selection line LSL, multiple layers of word lines WL, and at least one layer of an upper selection line USL which are sequentially stacked over a substrate SUB equipped with a source region S. The semiconductor device further includes vertical channel layers CH configured to penetrate the lower selection line LSL, the word lines WL, and the upper selection line USL, a memory layer (not shown) configured to substantially surround the vertical channel layers CH, and bit lines BL extended in a second direction II-II'. The bit lines B are coupled to the tops of the vertical channel layers CH arranged in the second direction II-II'.

Figure 14:
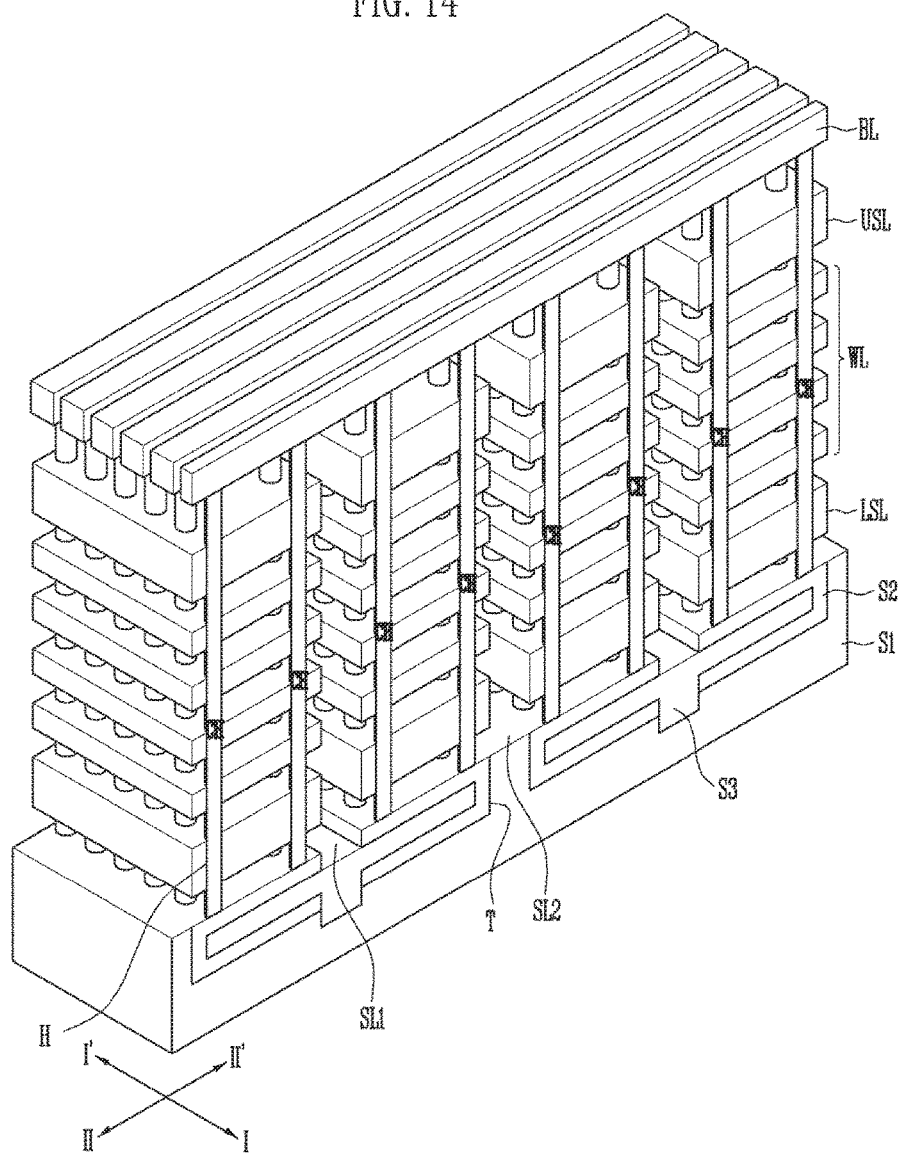

FIG. 14 is a perspective view showing the cell structure of a semiconductor device to which embodiments of this disclosure has been applied. For ease of description, an insulating layer is not shown.

As shown in FIG. 14, the semiconductor device in accordance with an example embodiment of this disclosure includes a first source layer S1, one or more second source layers S2 formed within the first source layer S1, conductive layers (LSL, WL, USL) stacked over the first source layer S1 in multiple layers, semiconductor pillars configured to penetrate the conductive layers and coupled to the second source layers S2, and third source layers S3 formed within the second source layers S2, respectively, configured to penetrate the second source layers S2, and coupled to the first source layer S1.

The semiconductor device further includes a memory layer (not shown) configured to substantially surround the outer surfaces of the semiconductor pillars and the second source layers S2 and bit lines BL formed at the tops of the conductive layers and extended in a second direction II-II'. The bit lines BL are coupled to respective semiconductor pillars arranged in the second direction II-II'.

From among the conductive layers stacked in multiple layers, one or more conductive layers at the bottom may be used as lower selection lines LSL, one or more conductive layers at the top may be used as upper selection lines USL, and the remaining conductive layers may be used as word lines WL.

Each of the first to third source layers S1 to S3 may be formed of a polysilicon layer or a metal layer into which an impurity has been doped. For example, each of the first and the second source layers S1 and S2 may be formed of a polysilicon layer into which an N type impurity has been doped, and the third source layer S3 may be formed of a metal layer made of tungsten (W).

The semiconductor pillar may be used as channel layers CH. For example, the semiconductor pillar may be formed of a polysilicon layer into which an impurity has not been doped. Furthermore, the semiconductor pillars may be integrally coupled to the second source layers S2.

A method of manufacturing the semiconductor device having the above stack structure is described below. Before forming the stack structure, the first source layer S1 is formed. After forming trenches T by etching the first source layer S1, a sacrificial layer (not shown) is formed within the trenches. The trenches T may be formed in an area where the second and third source layers S2 and S3 are formed. Channel holes H coupled to the trenches T are formed over the first source layer S1 in which the sacrificial layer is formed, by etching first material layers and second material layers. The sacrificial layer exposed at the bottom of the channel holes H is removed. Next, a semiconductor layer is formed on the inside of the trenches T and the channel holes H. A first slit SL1 having a depth extended down to the first source layer S1 is formed between the channel holes H above an area where the third source layer S3 may be formed. An impurity is doped into the semiconductor layers formed within the trenches T through the first slits SL1, thereby forming the second source layers S2. Next, the third source layers S3 coupled to the first source layer S1 are formed within the second source layers S2 and a lower portion of the first slits SL1.

Figure 15:
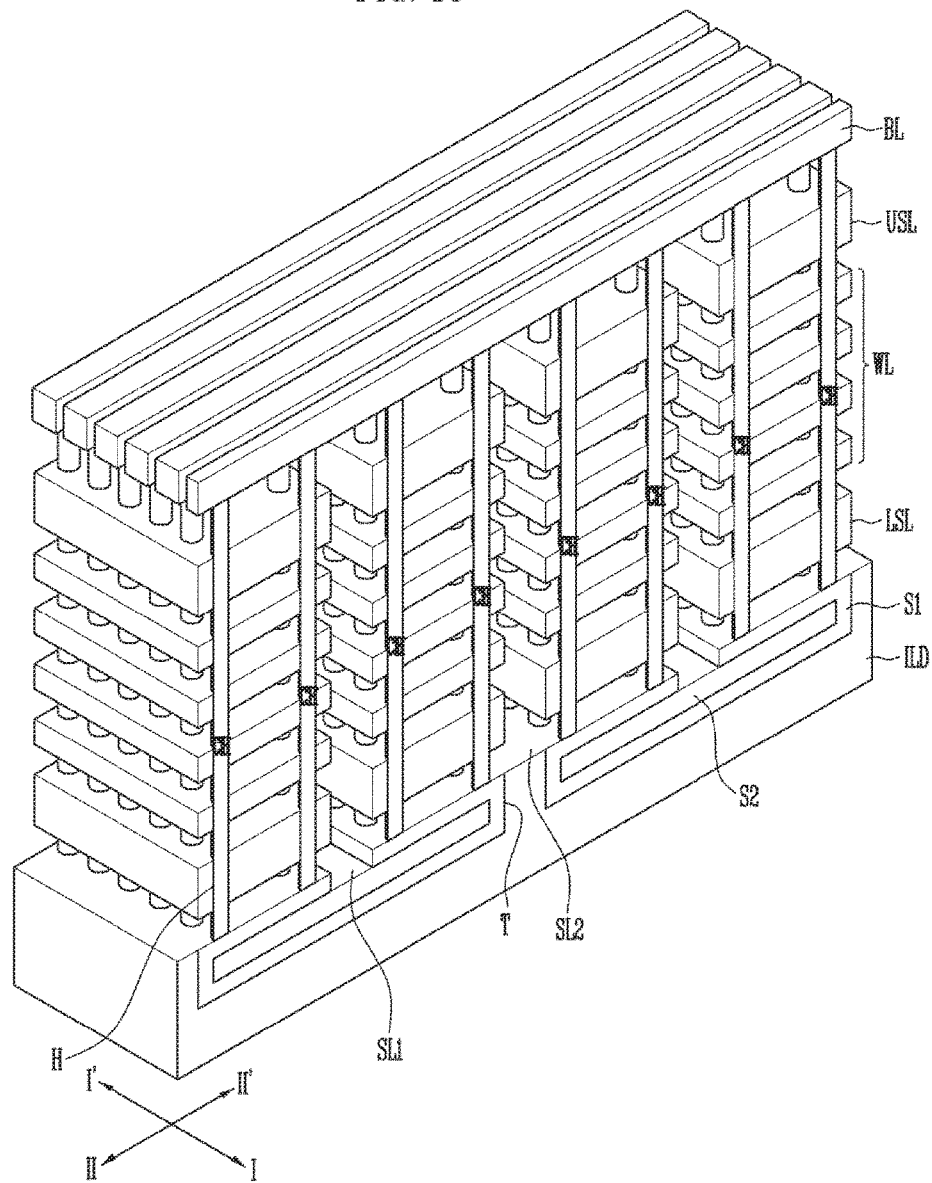

FIG. 15 is a perspective view showing the cell structure of a semiconductor device to which embodiments of this disclosure has been applied. For ease of description, an insulating layer is not shown.

As shown in FIG. 15, the semiconductor device in accordance with an example embodiment of this disclosure includes an interlayer insulating layer ILD, one or more first source layers S1 formed within the interlayer insulating layer ILD, conductive layers (LSL, WL, USL) stacked in multiple layers over the interlayer insulating layer ILD, semiconductor pillars configured to penetrate the conductive layers and coupled to the first source layers S1, and second source layers S2 formed within the first source layers S1, respectively. The semiconductor device further includes a memory layer (not shown) configured to substantially surround the outer surfaces of the semiconductor pillars and the first source layer S1 and bit lines BL formed over the conductive layers and extended in a second direction II-II'.

Here, the semiconductor pillars may be used as channel layers CH, and the conductive layers may be used as lower selection lines LSL, word lines WL, or upper selection lines USL.

Furthermore, the first source layer S1 may be formed by doping an impurity into the semiconductor layer, and the second source layer S2 may be formed of a metal layer. In this case, the characteristics of the semiconductor device can be improved because source resistance is reduced.

In FIG. 15, the first source layer S1 is illustrated as fully surrounding the bottom of the second source layer S2. In some embodiments, the bottom of the second source layer S2 may be partially protruded so that the protruded part penetrates the first source layer S1.

A method of forming the cell structure of the semiconductor device having the above stack structure is described below. Before forming the stack structure, the interlayer insulating layer ILD is formed. Next, trenches T are formed by etching the interlayer insulating layer ILD. The trenches T may be formed in an area where the first and second source layers S1 and S2 are formed. After forming a sacrificial layer (not shown) within the trenches T, first material layers and second material layers are alternately formed over the interlayer insulating layer in which the sacrificial layer is formed. Channel holes H coupled to the trenches T are formed by etching the first material layers and the second material layers. Next, the sacrificial layer exposed at the bottom of the channel holes is removed. Next, a semiconductor layer is formed on the inside of the trenches T and the channel holes H. Next, a first slit SL1 having a depth extended down to at least the trenches T is formed between the channel holes H. An impurity is doped into the semiconductor layers formed within the trenches T through the first slits SL1, thereby forming the first source layers S1. The second source layers S2 are formed within the first source layers S1, respectively.

Figure 16:
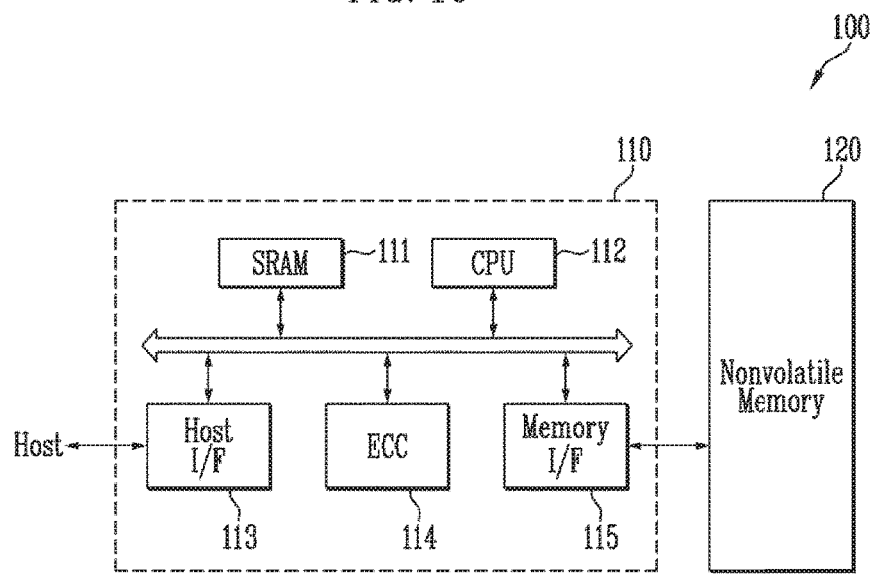
FIG. 16 shows a construction of a memory system in accordance with an example embodiment of this disclosure.

FIG. 16 shows a construction of a memory system in accordance with an example embodiment of this disclosure.

As shown in FIG. 16, the memory system 100 in accordance with an example embodiment of this disclosure includes a nonvolatile memory device 120 and a memory controller 110.

The nonvolatile memory device 120 is configured to have a memory cell including the pad structures described in connection with the first or second embodiment. Furthermore, the nonvolatile memory device 120 may be a multi-chip package including a plurality of flash memory chips.

The memory controller 110 is configured to control the nonvolatile memory device 120, and it may include SRAM 111, a Central Processing Unit (CPU) 112, a host interface (I/F) 113, an ECC circuit 114, and a memory interface (I/F) 115. The SRAM 111 is used as the operating memory of the CPU 112. The CPU 112 performs an overall control operation for data exchange of the memory controller 110. The host I/F 113 is equipped with the data exchange protocol of a host that accesses the memory system 100. Furthermore, the ECC 114 circuit detects and corrects errors included in data read from the nonvolatile memory device 120. The memory I/F 115 performs as an interface for the nonvolatile memory device 120. The memory controller 110 may further include RCM for storing code data for an interface with the host.

The memory system 100 configured as described above may be a memory card or a Solid State Disk (SSD) in which the nonvolatile memory device 120 and the controller 110 are combined. For example, if the memory system 100 is an SSD, the memory controller 110 may communicate with the outside (for example, a host) through one of various interface protocols, such as USB, MMC, PCI-E, SATA, PATA, SCSI, ESDI, and IDE.

Figure 17:
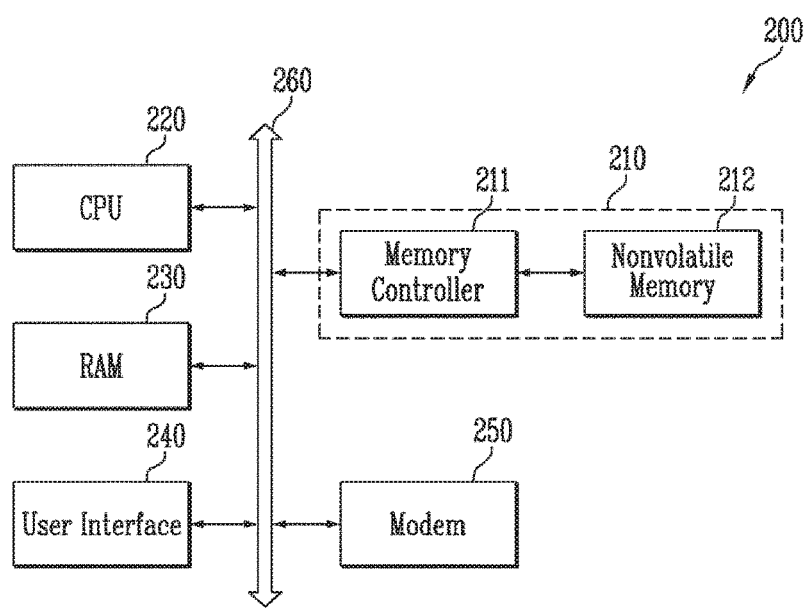
FIG. 17 shows a construction of a computing system in accordance with an example embodiment of this disclosure.

FIG. 17 shows a construction of a computing system in accordance with an example embodiment of this disclosure.

As shown in FIG. 17, the computing system 200 according to an embodiment of this disclosure may include a CPU 220, RAM 230, a user interface 240, a modem 250, and a memory system 210 all of which are electrically coupled to a system bus 260. If the computing system 200 is a mobile device, the computing system 200 may further include a battery for supplying operating voltages to the computing system 200. The computing system 200 may further include application chipsets, a Camera Image Processor (CIS), mobile DRAM, and so on.

The memory system 210 may include a nonvolatile memory device 212 and a memory controller 211, such as those described above with reference to FIG. 16.

In this disclosure, a nonvolatile memory device, particularly, a 3-D NAND flash device in which word lines are stacked has been described as an example, but this disclosure is not limited thereto. This disclosure may be applied to all semiconductor devices including stacked conductive layers and may also be applied to volatile memory devices, such as DRAM, and nonvolatile memory devices, such as RERAM and PCRAM.

As described above, the semiconductor device includes a plurality of pad structures placed on opposite sides of a cell structure. Here, the pad structures have asymmetrical step forms. Accordingly, the area of a slimming region can be reduced and a slimming process can be simplified as compared with a known art.

What is claimed is:

1. A method of manufacturing a semiconductor device, comprising:
    forming a stack structure in which a cell region and slimming regions placed on opposite sides of the cell region are defined;
    performing a primary slimming process of selectively etching the slimming regions of the stack structure to form a cell structure and n first pad structures and n second pad structures placed on opposite sides of the cell structure, wherein the slimming regions are selectively etched so that steps are formed between the first and the second pad structures; and
    performing a secondary slimming process of forming a mask pattern through which ends of the first and the second pad structures are exposed over the stack structure and etching 2n layers of the first and the second pad structures using the mask pattern as an etch barrier so that each of the first and the second pad structures has a step form in which 2n layers form one stage,
    wherein the n is a natural number of 1 or higher, and
    wherein the first and the second pad structures are patterned in a step form having a step extended in a direction away from the cell structure, such that steps of each of the first and the second pad structures descend as the first and second pad structures extend away from the cell structure.

2. The method of claim 1, wherein the primary slimming process comprises:
    forming a first mask pattern through which a pair of the first and second pad structures placed on opposite sides are exposed and etching one layer of the first and the second pad structures using the first mask pattern as an etch barrier; and
    forming a second mask pattern through which the second pad structures are exposed and etching n layers of the second pad structures using the second mask pattern as an etch barrier.

3. The method of claim 2, wherein:
    etching one layer of the first and the second pad structures is performed (n−1) times, and
    when etching one layer of the first and the second pad structures is performed repeatedly, the first mask pattern is reduced so that the pair of first and second pad structures placed on opposite sides is further exposed, and one layer of the first and the second pad structures is etched using the reduced first mask pattern as an etch barrier.

4. The method of claim 1, wherein the secondary slimming process comprises repeatedly performing a process of reducing the mask pattern and etching 2n layers of the first and the second pad structures using the reduced mask pattern as an etch barrier.

5. The method of claim 1, wherein each of layer of the first and the second pad structures comprises a first interlayer insulating layer and a first conductive layer.

6. The method of claim 5, wherein:
the cell structure comprises second interlayer insulating layers and second conductive layers which are alternately stacked,
the first interlayer insulating layer and the second interlayer insulating layer, formed at a substantially same level, are coupled, and
the first conductive layer and the second conductive layer, formed at a substantially same level, are coupled.

7. The method of claim 1, further comprising forming first channel layers configured to penetrate the cell region of the stack structure in the stack direction.

8. The method of claim 1, further comprising:
forming a first source layer, before forming the stack structure;
forming trenches by etching the first source layer;
forming a sacrificial layer within the trenches;
forming channel holes coupled to the trenches by etching the stack structure;
removing the sacrificial layer exposed at bottoms of the channel holes;
forming a semiconductor layer on insides of the trenches and the channel holes;
forming a first slit, having a depth extended up to the first source layer, between the channel holes;
forming second source layers by doping an impurity into the semiconductor layers, formed on the insides of the trenches, through the first slits; and
forming third source layers within the second source layers and a lower portion of the first slits, wherein the third layer is coupled to the first source layer.

9. The method of claim 1, further comprising:
forming an interlayer insulating layer, before forming the stack structure;
forming trenches by etching the interlayer insulating layer;
forming a sacrificial layer within the trenches;
forming channel holes coupled to the trenches by etching the stack structure;
removing the sacrificial layer exposed at bottoms of the channel holes;
forming a semiconductor layer on insides of the trenches and the channel holes;
forming a first slit, having a depth extended up to at least the trenches, between the channel holes;
forming a first source layer by doping an impurity into the semiconductor layers, formed on the insides of the trenches, through the first slits; and
forming second source layers within the first source layer.

10. A method of manufacturing a semiconductor device, comprising:
forming a stack structure in which a cell region and slimming regions placed on opposite sides of the cell region are defined;
performing a primary slimming process of selectively etching the slimming regions of the stack structure to form a cell structure and n first pad structures and n second pad structures placed on opposite sides of the cell structure, wherein the slimming regions are selectively etched so that steps are formed between the first and the second pad structures; and
performing a secondary slimming process of forming a mask pattern through which ends of the first and the second pad structures are exposed over the stack structure and etching 2n layers of the first and the second pad structures using the mask pattern as an etch barrier so that each of the first and the second pad structures has a step form in which 2n layers form one stage,
wherein the n is a natural number of 1 or higher,
wherein first pad structures adjacent to each other, from among the first pad structures, have a step of one layer,
wherein second pad structures adjacent to each other, from among the second pad structures, have a step of one layer, and
wherein the first pad structure and the second pad structure placed on opposite sides of the cell region have a step of n layers.

11. A method manufacturing a semiconductor device, comprising:
forming a stack structure including n first pad structures, n second pad structures and a cell structure located between the n first pad structures and the n second pad structures;
selectively etching the n first pad structures and the n second pad structures so that a step is formed between neighboring first pad structures and a step is formed between neighboring second pad structures;
selectively etching the n first pad structures and the n second pad structures so that a step is formed between a first pad structure and a second pad structure facing each other; and
selectively etching the n first pad structures and the n second pad structures so that each of the first and second pad structures has a step form in which 2n layers form one stage and steps descend as the first and second pad structures extend away from the cell structure,
wherein the n is a natural number of 2 or higher,
a step of one layer exists between the neighboring first pad structures,
a step of one layer exists between the neighboring second pad structures, and
a step of n layers exists between the first pad structure and the second pad structure facing each other.

* * * * *